US008487391B2

(12) United States Patent
Kim et al.

(10) Patent No.: US 8,487,391 B2
(45) Date of Patent: Jul. 16, 2013

(54) MAGNONIC CRYSTAL SPIN WAVE DEVICE CAPABLE OF CONTROLLING SPIN WAVE FREQUENCY

(75) Inventors: Sang-koog Kim, Seoul (KR); Ki-suk Lee, Seoul (KR); Dong-soo Han, Daejeon (KR)

(73) Assignee: Seoul National University Industry Foundation, Seoul (KR)

( * ) Notice: Subject to any disclaimer, the term of this patent is extended or adjusted under 35 U.S.C. 154(b) by 323 days.

(21) Appl. No.: 12/994,158

(22) PCT Filed: May 28, 2009

(86) PCT No.: PCT/KR2009/002850
§ 371 (c)(1), (2), (4) Date: Dec. 22, 2010

(87) PCT Pub. No.: WO2009/145579
PCT Pub. Date: Dec. 3, 2009

(65) Prior Publication Data
US 2011/0102106 A1 May 5, 2011

(30) Foreign Application Priority Data
May 28, 2008 (KR) ........................ 10-2008-0049681

(51) Int. Cl.
*H01L 29/82* (2006.01)

(52) U.S. Cl.
USPC ........... 257/421; 257/422; 257/423; 257/424; 257/425; 257/427; 438/3; 428/692.1; 333/186

(58) Field of Classification Search
USPC ..... 257/421–427; 438/3; 428/692.1; 333/186
See application file for complete search history.

(56) References Cited

FOREIGN PATENT DOCUMENTS

| | | |
|---|---|---|
| JP | 10-135709 | 5/1998 |
| JP | 2005025831 | 1/2005 |

OTHER PUBLICATIONS

Magneto-photonic and Magnonic Crystals Based on Ferrite Films—New Types of Magnetic Functional Materials, Advances in Science and Technology vol. 45 (2006) pp. 1355-1363.*
Choi, Sang-Kook et al., Vortex-motion driven spin-wave generation and propagation, Collection of thesis abstracts for Summer conference and International workshop on next-generation HDD technology, The Korean Magnetics Society, Jun. 2005. Bol. 15 No. 1, pp. 184-185.

* cited by examiner

*Primary Examiner* — Jami M Valentine
(74) *Attorney, Agent, or Firm* — Lexyoume IP Meister, PLLC.

(57) ABSTRACT

There is provided a magnonic-crystal spin wave device capable of controlling a frequency of a spin wave. The magnonic-crystal spin wave device according to the invention includes a spin wave waveguide made of magnetic material, and the spin wave waveguide guides the spin wave so as to propagate in one direction, and includes a magnonic crystal part which has a cross-section orthogonal to the direction, and at least one of a shape, area size, and center line of the cross-section periodically changes in the direction. In accordance with the invention, it is possible to easily control the frequency of the spin wave using the spin wave waveguide made of single magnetic material.

9 Claims, 8 Drawing Sheets

MAGNONIC CRYSTAL SPIN WAVE DEVICE CAPABLE OF CONTROLLING SPIN WAVE FREQUENCY

CROSS-REFERENCE TO RELATED APPLICATIONS

This application claims priority from Korean Patent Application No. 10-2008-0049681, filed on May 28, 2008 in the Korean Intellectual Property Office, the entire disclosure of which is incorporated herein by reference.

TECHNICAL FIELD

The invention relates to a spin wave device, and, more particularly, to a magnonic-crystal spin wave device capable of controlling a frequency of a spin wave.

RELATED ARTS

A CMOS-based information processing methodology has an expected limit resulting from following reasons. First, a thickness of a gate oxide film should gradually reduce in order to improve integration level. However, when the thickness of the gate oxide film becomes 0.7 nm, electrons may pass through the gate oxide film in the thickness direction, so that the gate oxide may not act as an insulating film. Second, in case a width of a wire diminishes in order to improve integration level, short-circuit may occur with the wire due to increase of current density.

For replacement of the CMOS-based information processing methodology, such an information processing approach based on the movement of electrical charges has been avoided, but, rather, a new information processing approach using quantum characteristics such as spin characteristics belonging to the electron characteristics has been studied. For example, MQCA (Magnetic Quantum Cellular Automata) devices using soliton in magnetic-nanoparticles has been studied; or applications of the spin wave generated in magnetic material to the information transfer and process have been studied.

Spin waves (called magnons) are collective excitations of individual spins in ordered magnets. When energy is applied to the magnetic materials such as ferromagnets, antiferromagnets, ferrimagnets, etc, the spins in the magnetic materials do precession motion due to magnetic interactions between the spins such as dipole-dipole interaction or exchange interaction, thereby exhibiting the wave forms which are called the spin waves.

The spin wave is classified into several kinds thereof based on the dominating interactions. First, there is a magnetostatic wave having the wavelength of several tens of μm to several of cm based on the dipole-dipole interaction. Second, there is an exchange spin wave having the wavelength equal to or smaller than several nm based on the exchange interaction. Third, there is a dipole-exchange spin wave having the wavelength of several nm to several μm based on the competition between the dipole-dipole interaction and the exchange interaction.

The methods of generating the spin wave are as follows. For example, according to U.S. Pat. Nos. 4,208,639, 4,316,162, and 5,601,935, when the electrical voltage is applied to the conductive line formed on the surface of the thin film made of the ferromagnetic material such as YIG (yttrium iron garnet) and thus the electromagnetic wave is generated, there occurs the magnetostatic wave with high frequency due to the strong combination of the generated electromagnetic wave and the magnetostatic wave of the ferromagnetic material. The resulting magnetostatic wave with high frequency has typically the wavelength in a range of 10 μm to 1 mm. Moreover, according to Korean patent application publication No. 2007-0036673, when energy is supplied to a magnetic substance where individual magnetic vortex and magnetic antivortex spin structures exist independently or together, the dipole-exchange spin waves are locally generated from the central part of the magnetic vortex spin structure or the magnetic antivortex spin structure. However, the above-mentioned spin wave generation methods may generate simultaneously a plurality of the spin waves with different frequencies and wavelengths from each other. Therefore, it is necessary to select or control the spin waves so as to have a desired frequency band and wavelength range in order to employ the spin wave in the information processing device.

Conventional methods of controlling the spin wave are as follows. In the article titled as "Spin waves in periodic magnetic structures-magnonic crystals" by S. A. Nikitov, Ph. Tailhades and C. S. Tsai, and at Journal of Magnetism and Magnetic Materials Volume 236, Issue 3 Nov. 2001, Pages 320-330, there is disclosed the spin wave controlling method using a periodic multilayered magnetic structure consisting of the different magnetic thin films from each other. According to this article, the frequency bandgap existing in the frequency range of the spin wave is formed within the magnetic material and hence the spin wave with the specific frequency and wavelength may not pass through the magnetic material, thereby filtering out the spin wave with the specific frequency and wavelength. Further, the location and width of the bandgap of the spin wave may vary depending on the thickness of the magnetic thin film and the magnetic properties of the magnetic material forming the thin film, and, accordingly, it is possible to control the frequency and wavelength of the spin wave by appropriately selecting the magnetic material forming the thin film and adjusting the thickness of the thin film.

Moreover, in the article titled as "Magnonic crystal theory of the spin-wave frequency gap in low-doped manganites" by M. Krawczyk and H. Puszkarski and at J. Appl. Phys., 100, 073905 (2006), there is disclosed the spin wave controlling method using the periodic doping of different magnetic materials into the matrix made of the magnetic material. According to this article, the frequency bandgap existing in the frequency range of the spin wave is formed by periodically doping the different magnetic materials into the matrix. Further, it is possible to control the location and width of the bandgap by appropriately selecting the doped magnetic material, thereby controlling the frequency and wavelength of the spin wave.

The above-mentioned spin wave controlling methods are in common with each other in that there is used a magnonic crystal in which a spin wave frequency bandgap forbidding the specific frequency is formed by periodically placing materials with different magnetic properties from each other. However, it is difficult in terms of the manufacturing process to periodically arrange the different magnetic materials. Although the different magnetic materials may be periodically arranged, the interface state between the thin films made of different magnetic materials may not become smooth as in the regular spin lattice structure made of single magnetic material, so that it is impossible to control the frequency of the spin wave in high accurate manner. Moreover, it is problematic that the width of the bandgap formed using the above-mentioned conventional spin wave controlling methods becomes small and consequently it is not effective in filtering out the spin waves in a broad range of the frequency. Further, in the above-mentioned conventional spin wave controlling methods, infinite virtual materials are assumed in a 2 or 3 dimensional manner, and, hence, real and practical structures being available as the spin wave device are not set forth.

SUMMARY OF THE INVENTION

Problem to be Solved

An object of the invention is to provide a spin wave device capable of easily controlling frequency of a spin wave using a simple magnetic structure.

Solution for the Problem

In order to solve the problem, the spin wave device according to the invention includes a spin wave waveguide made of magnetic material, and the spin wave waveguide guides a spin wave so as to propagate in one direction, and comprises a magnonic crystal part which has a cross-section orthogonal to the direction, and at least one of a shape, area size, and center line of the cross-section periodically changes in the direction.

Effects Of The Invention

In accordance with the invention, it is possible to easily control the frequency of the spin wave using the spin wave waveguide made of single magnetic material. Moreover, the process of manufacturing the spin wave device becomes simple because the spin wave waveguide made of the single magnetic material is employed. Further, in case of the spin wave device including the magnonic crystal part in which a unit body is periodically formed directly as the spin wave waveguide, the entire size of the device comes into reducing, thereby improving the integration level of the device. As the size of the device becomes smaller, the information processing speed of the device may improve.

BRIEF DESCRIPTION OF THE ACCOMPANYING DRAWINGS

Figure 6:
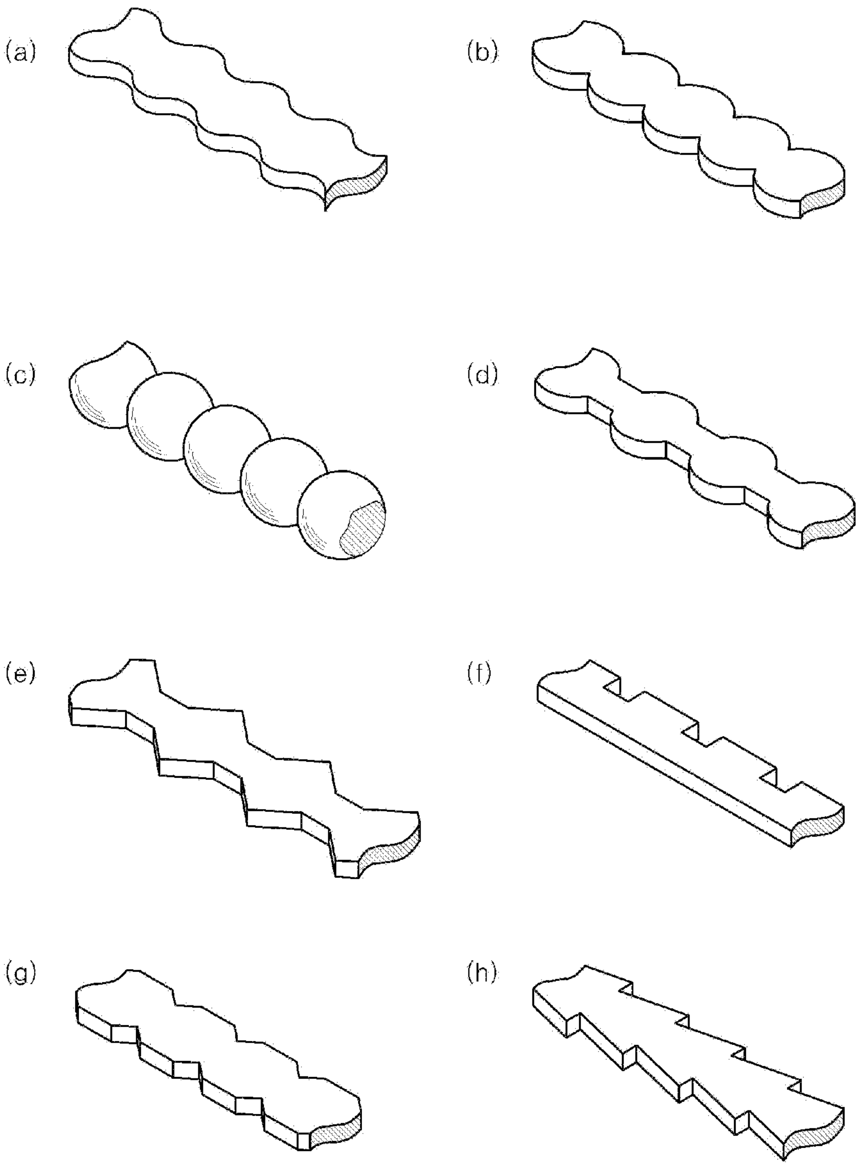
Figure 7:
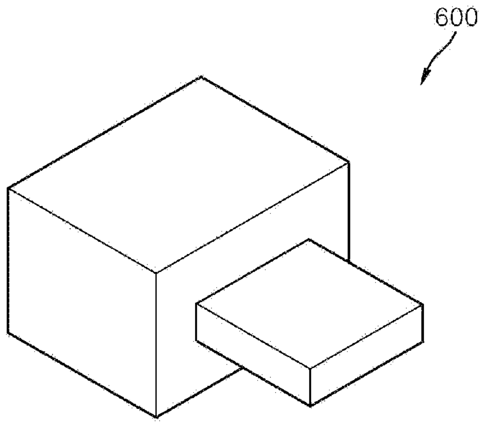
Figure 8:
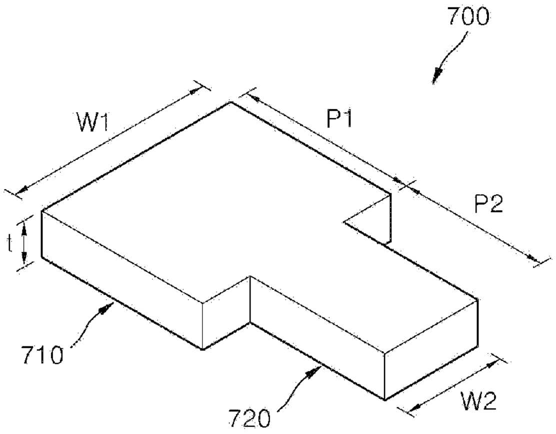
Figure 9:
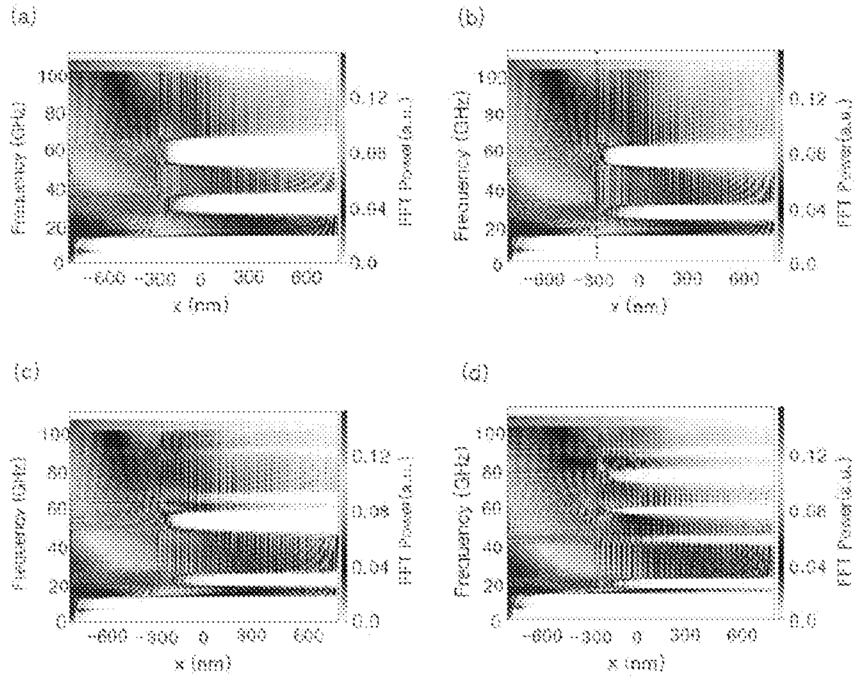
Figure 10:
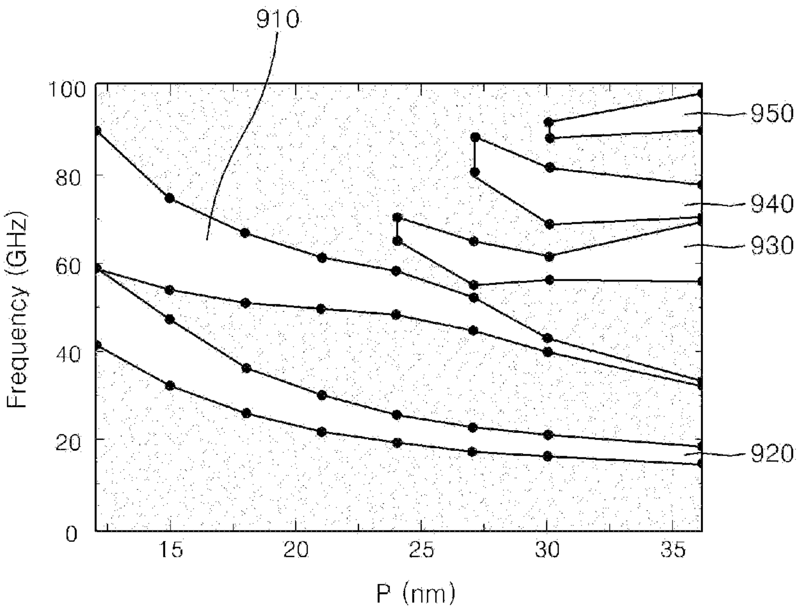
Figure 11:
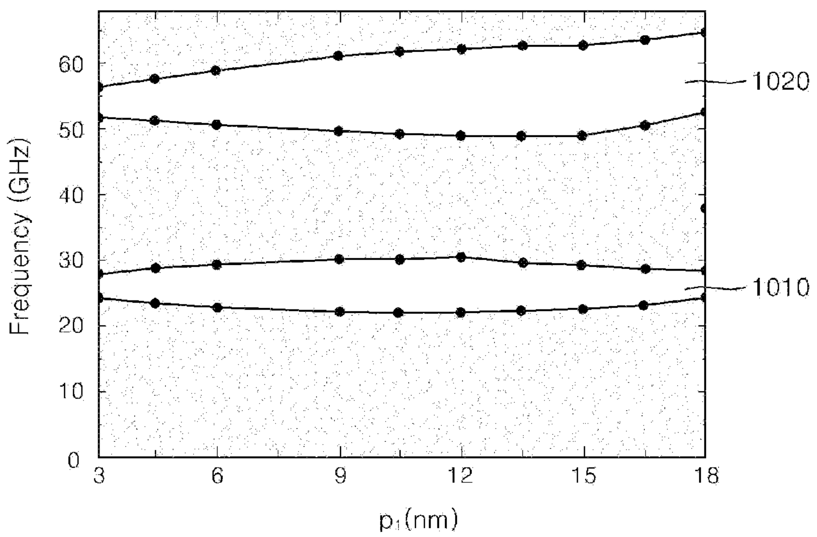
Figure 12:
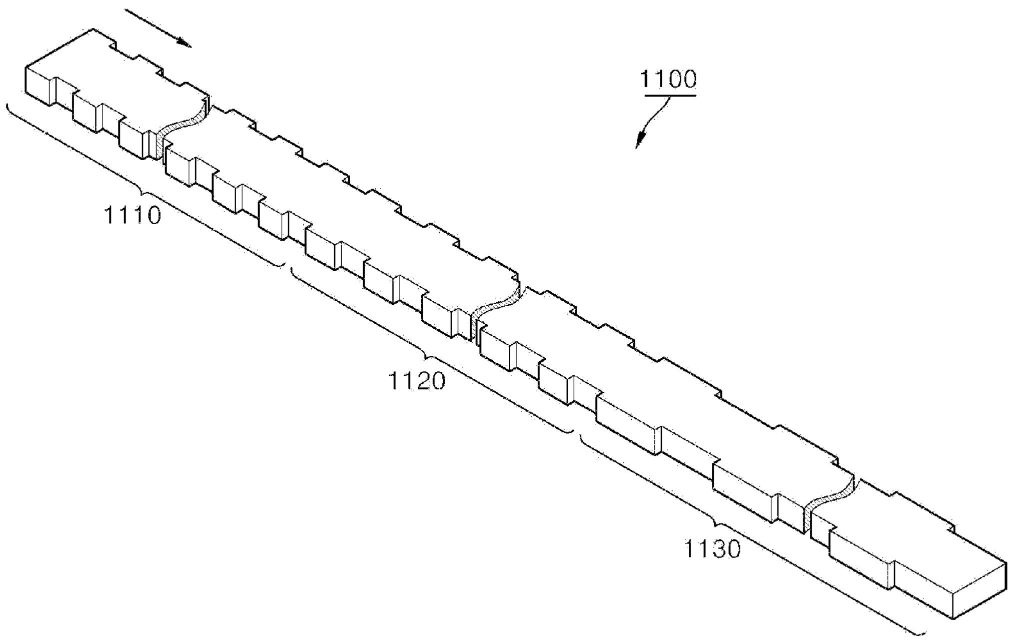
Figure 13:
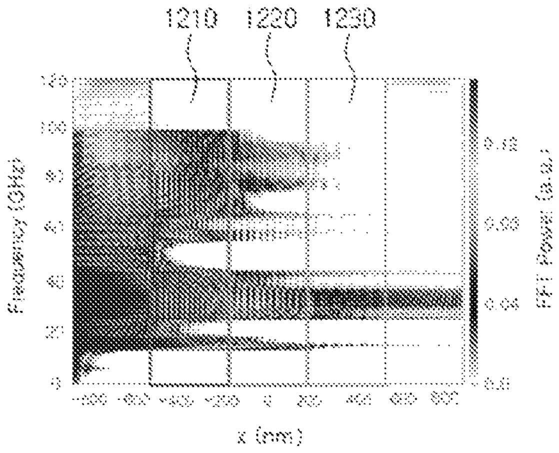

FIG. 6(*a*) to FIG. 6(*h*) illustrate preferred exemplary embodiments of the magnonic crystal parts employed in the spin wave device according to the invention;

FIG. 7 and FIG. 8 illustrate preferred exemplary embodiments of a unit body employed in the spin wave device according to the invention;

FIG. 9(*a*) to FIG. 9(*d*) show the results of observing, in the computer simulation manner, the frequency modes of the spin wave depending on the location of the waveguide after the spin wave passes through the magnonic crystal part formed using the unit body 700 as shown in FIG. 8;

FIG. 10 is a graph illustrating variations of the frequency bandgap depending on the length in the propagating direction of the spin wave of the unit body;

FIG. 11 is a graph illustrating variations of the frequency bandgap depending on the length in the propagating direction of the spin wave of the first magnetic substance;

FIG. 12 illustrates in a schematic manner one preferred exemplary embodiment of the spin wave device including the spin wave waveguide including a plurality of the magnonic crystal parts according to the invention; and FIG. 13 shows the results of observing, in the computer simulation manner, the frequency modes of the spin wave depending on the location of the waveguide after the spin wave passes through the spin wave device as shown in FIG. 12.

DETAILED DESCRIPTION OF THE EXEMPLARY EMBODIMENTS

Below, the preferred exemplary embodiments of a magnonic crystal spin wave device capable of the frequency of the spin wave according to the invention will be described in details with reference to the accompanying drawings. However, the invention is not limited to the preferred exemplary embodiments as described later but the invention may be practiced with other various embodiments. Accordingly, the preferred exemplary embodiments make the skilled persons in this art more completely understand the invention and more easily practice the inventive concepts.

Figure 1:
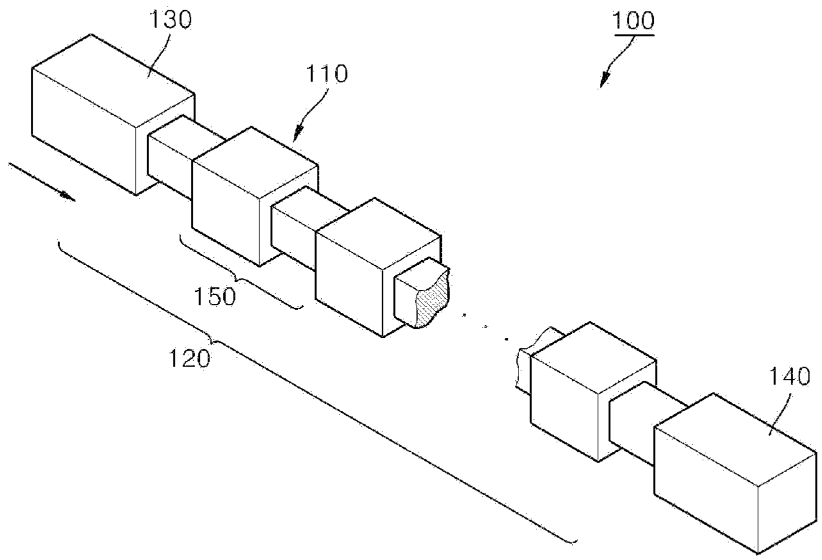
FIG. 1 to FIG. 3 illustrate preferred exemplary embodiments of a spin wave device according to the invention.
Figure 2:
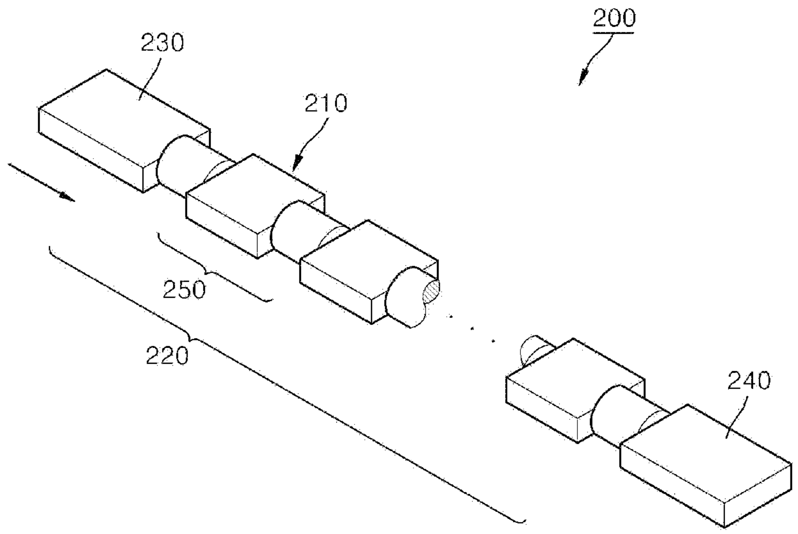
Figure 3:
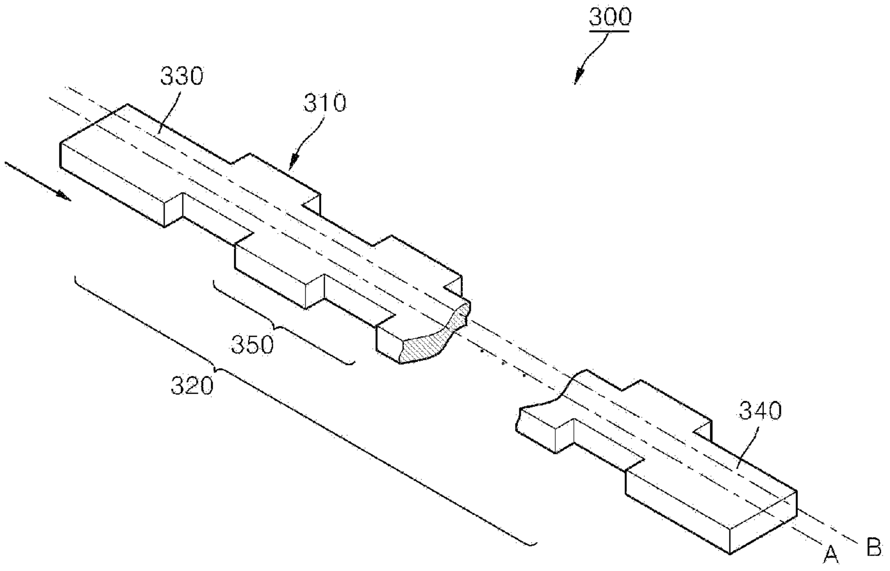

FIG. 1 to FIG. 3 illustrate preferred exemplary embodiments of a spin wave device according to the invention.

Referring to FIG. 1 to FIG. 3, a spin wave device 100, 200, 300 according to the invention includes a spin wave waveguide 110, 210, 310 made of magnetic material which guides the spin wave so as to propagate in one direction. The spin wave waveguide 110, 210, 310 includes a magnonic crystal part 120, 220, 320 which has a cross-section orthogonal to the direction, and at least one of a shape, area size, and center line of the cross-section of the magnonic crystal part 120, 220, 320 periodically changes in the direction. The magnonic crystal part 120, 220, 320 guides the spin wave so as to propagate in the direction. The spin wave waveguide 110, 210, 310 is made of ferromagnetic substance, anti-ferromagnetic substance, ferromagnetic substance, alloy based magnetic substance, oxide based magnetic substance, Heusler alloy based magnetic substance, magnetic semiconductor or combinations thereof. Moreover, the spin wave waveguide 110, 210, 310 includes a spin wave input part 130, 320, 330 to which the spin wave is input from an external or other magnonic crystal part; and a spin wave output part 140, 240, 340 which outputs the spin wave from the magnonic crystal part 120, 220, 320 to an external or other magnonic crystal part.

Here, FIG. 1 illustrates the spin wave device 100 in which the area size of the cross-section periodically changes in the wave guided direction. FIG. 2 illustrates the spin wave device 200 in which the shape of the cross-section periodically changes in the wave guided direction. FIG. 3 illustrates the spin wave device 100 in which the center line of the cross-section periodically changes in the wave guided direction.

The shapes of the cross-sections orthogonal to the wave guided direction of the magnonic crystal part 120 included in the spin wave device 100 of FIG. 1 all are identical with a square shape and the center lines thereof are in the same line. However, the area sizes of the cross-sections periodically change in the wave guided direction. The area sizes of the cross-sections orthogonal to the wave guided direction of the magnonic crystal part 220 included in the spin wave device 200 of FIG. 2 all are equal to each other and the center lines thereof are in the same line. However, the shapes of the cross-sections periodically change from a square shape to a circle shape in the wave guided direction. The shapes of the cross-sections orthogonal to the wave guided direction of the magnonic crystal part 320 included in the spin wave device 300 of FIG. 3 all are identical with a rectangular shape and the area sizes thereof are equal to each other. However, the center lines of the cross-sections periodically change between the virtual lines A, B. FIG. 1 to FIG. 3 illustrate the spin wave devices 100, 200, 300 including the magnonic crystal parts 120, 220, 320 in which one of the shape, area size, and center line of the cross-section periodically changes in the direction individually. However, two of the shape, area size, and center line of the cross-section may periodically change in the direction; or all of the shape, area size, and center line of the cross-section may periodically change in the direction.

The resultant spin wave devices 100, 200, 300 may control the frequency of the spin wave easily.

When a wave such as a spin wave passes through the periodical arrangements with different magnetic properties, the wave transmits and reflects from the interfaces between the periodical arrangements with the different magnetic properties. The waves reflecting from the interfaces with the same phase as each other may be constructively interfered with each other. Then, the constructively-interfered waves are superposed with the wave which transmitted the interfaces, resulting in forming a stationary wave with a specific frequency. The resulting stationary wave may not pass through the periodical arrangements with the different magnetic properties. At this time, the frequency of the stationary wave is in a certain range which is called the bandgap. That is, when the wave passes through the periodical arrangements with the different magnetic properties, the frequency corresponding to the bandgap may not pass through the periodical arrangements but becomes filtered out. The location and width of the bandgap are depending on the properties of the materials in and along which the wave propagates and the periodical characteristics of the periodical arrangements.

Figure 4:
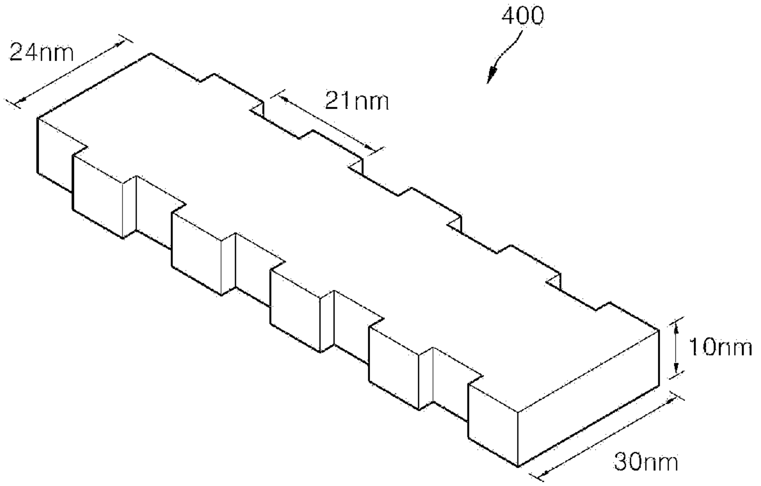
FIG. 4 and FIG. 5 are shown to illustrate a resulting stationary wave formed in the magnonic crystal part.
Figure 5:
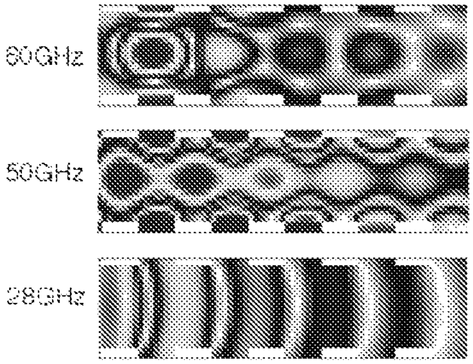

Conventionally, such periodical arrangements have been acquired by periodically placing the different magnetic materials. However, when the spin wave passes through such periodical arrangements acquired by periodically placing the different magnetic materials, one dimensional stationary waves are formed, thereby forming the bandgap just with the small frequency range. However, in accordance with the invention, when the spin wave passes through the magnonic crystal part which has the cross-section orthogonal to the wave guided direction whose at least one of the shape, area size, and center line periodically changes in the direction, two or three dimensional stationary waves are formed, thereby forming the bandgap with the large frequency range. For example, when the spin wave passes through the magnonic crystal part 400 as shown in FIG. 4, a resulting stationary wave is shown in FIG. 5. As shown in FIG. 5, a variety of two or three dimensional stationary waves are formed and hence the bandgap is formed with the large frequency range. As shown in FIG. 5, as each of the spin waves with different frequencies from one another propagates along the magnoic crystal part, the stationary waves are formed and thus may not progress forward. The white region at which an absolute value of the spin wave becomes zero refers to a node of the stationary wave.

Minimum periodical arrangements in the magnonic crystal parts 120, 220, 320, that is, a magnetic substance corresponding to one period is referred to as a unit body 150, 250, 350. Other various forms of the magnonic crystal parts than those shown in FIG. 1 to FIG. 3 may be acquired using many variations of such a unit body. Such many variations are shown in FIG. 6(*a*) to FIG. 6(*h*). In those case, the magnonic crystal parts may have elongate flat plate shapes extending in the wave guided direction for the sake of the convenience of the manufacturing process.

As shown in FIG. 6(*a*) to FIG. 6(*h*), the magnonic crystal parts may have a variety of the shapes. For example, the shape and area size of the cross-section may intermittently change in the longitudinal direction; otherwise, the shape and area size of the cross-section may continuously change in the longitudinal direction. It is possible to easily control the frequency of the spin wave by forming the magnonic crystal parts with such various forms of the unit bodies.

Especially, in order that the manufacturing process becomes easy and the controlling of the frequency becomes simple, it is preferable that the magnonic crystal part is formed using the unit body 600 consisting of two magnetic substances with rectangular parallelepiped shapes as shown in FIG. 7. The unit body 600 as shown in FIG. 7 is configured so that two magnetic substances with different thickness and widths of the cross-sections from each other are coupled to each other in the wave guided direction. It should be apparent that if necessary, the number of the magnetic substances employed in the unit body may be other numbers than two.

In order to manufacture the spin wave device more simply, the magnonic crystal part is formed so that the thickness of the cross-section is constant and the width of the cross-section periodically changes. A unit body 700 of the magnonic crystal part manufactured in such a way is shown in FIG. 8. FIG. 9 to FIG. 11 illustrate the results appearing after the spin wave passes through the magnonic crystal part formed using the unit body 700 as shown in FIG. 8.

FIG. 8 illustrates the unit body 700 in which a first magnetic substance 710 with t thickness and $w_1$ width and $p_1$ length in the wave guided direction is coupled to a second magnetic substance 720 with t thickness and $w_2$ width and $p_2$ length in the wave guided direction. In this case, the first and second magnetic substances 710, 720 may be made of the same material as each other. Here, the thickness t may be in a range of 1 to 200 nm and the length ($P=p_1+p_2$) in the wave guided direction of the unit body 700 may be in a range of 5 to 500 nm When the thickness t and the length P in the wave guided direction of the unit body 700 are in the above ranges, it is possible to control the frequency of the dipole-exchange spin wave. That is, it is possible to control the frequency of the dipole-exchange spin wave more simply by forming the magnonic crystal part with the appropriate adjustment of the widths $w_1$, $w_2$ and the lengths $p_1$, $p_2$ as shown in FIG. 8. The size of the spin wave device using the dipole-exchange spin wave becomes smaller than the size of the spin wave device using the magnetostatic wave, and, accordingly, in the case of this example, the integration level of the spin wave device may improve and the processing rate of the spin wave may be enhanced.

FIG. 9(*a*) to FIG. 9(*d*) show the results of observing, in the computer simulation manner, the frequency modes of the spin wave depending on the location of the waveguide after the spin wave passes through the magnonic crystal part formed using the unit body 700 as shown in FIG. 8. At this time, the thickness t of the unit body 700 is set to 10 nm, and the width $w_1$ of the first magnetic substance is set to 30 nm, and the width $w_2$ of the second magnetic substance is set to 24 nm.

FIG. 9(*a*) corresponds to $p_1=p_2=9$ nm, FIG. 9(*b*) corresponds to $p_1=p_2=10.5$ nm, FIG. 9(*c*) corresponds to $p_1=p_2=12$ nm, and FIG. 9(*d*) corresponds to $p_1=p_2=15$ nm The frequency range of the spin wave passing through the magnonic crystal part is in a range of 0 to 100 GHz. As shown in FIG. 9(*a*) to FIG. 9(*d*), initially, the spin wave with the entire frequency range including 0 to 100 GHz may pass through the magnonic crystal part, but, following the moving by some distance, the spin waves with specific frequencies may not pass through the magnonic crystal part and are filtered out. The specific frequencies filtered out may vary depending on the lengths $p_1$, $p_2$. Accordingly, it is possible to easily control the frequency of the spin wave by filtering out the specific frequencies with the appropriate adjustment of the lengths $p_1$, $p_2$.

FIG. 10 illustrates variations of the frequency bandgap depending on the length in the propagating direction of the spin wave of the unit body 700. The length P in the propagating direction of the spin wave of the unit body is represented by $p_1+p_2$. At this case, as for the unit body 700, t=10 nm, $w_1$=30 nm, $w_2$=24 nm, and $p_1=p_2$. The frequency bandgaps are denoted by the white regions 910, 920, 930, 940, and 950 surrounded with the black solid lines.

As shown in FIG. 10, the width and location and number of the frequency bandgaps may vary depending on the length P in the propagating direction of the spin wave of the unit body. Accordingly, it is possible to form the bandgap with the desired width and location by appropriately adjusting the length P in the propagating direction of the spin wave of the unit body.

FIG. 11 illustrates variations of the frequency bandgap depending on the length $p_1$ in the propagating direction of the spin wave of the first magnetic substance 710. Here, the length P in the propagating direction of the spin wave of the unit body is kept constant with 21 nm. As for the unit body 700, t=10 nm, $w_1$=30 nm, $w_2$=24 nm, and $p_2$=21 nm$-p_1$. The frequency bandgaps are denoted by the white regions 1010, 1020 surrounded with the black solid lines.

As shown in FIG. 11, the frequency bandgaps may also vary depending on the length $p_1$ in the propagating direction of the spin wave of the first magnetic substance 710. Because the length P in the propagating direction of the spin wave of the unit body 700 is kept constant, the length $p_2$ in the propagating direction of the spin wave of the second magnetic substance 720 may vary when the length $p_1$ in the propagating direction of the spin wave of the first magnetic substance 710 varies. That is, although the length P in the propagating direction of the spin wave of the unit body 700 is kept constant, the frequency bandgaps may also vary as the inner shape of the unit body 700 varies.

Therefore, it should be appreciated from FIG. 9 to FIG. 11 that it is possible to filter out the desired frequencies by appropriately adjusting the lengths $p_1$ and $p_2$ in the propagating direction of the spin wave of the first and second magnetic substances 710, 720 and thus to form the bandgap with the desired width and location. Although not shown in the drawings, it is possible to change the width and location of the frequency bandgap by adjusting the widths $w_1$, $w_2$ of the first and second magnetic substances 710, 720.

FIG. 12 illustrates in a schematic manner one preferred exemplary embodiment of the spin wave device including the spin wave waveguide including a plurality of the magnonic crystal parts according to the invention. In FIG. 12, the spin wave device includes the plurality of the magnonic crystal parts formed using the unit body as shown in FIG. 8. However, the invention is not limited thereto but rather the spin wave device may include the plurality of the magnonic crystal parts whose cross-sections orthogonal to the propagation direction of the spin wave have at least one of the shape, area-size and center line which periodically changes in the direction. That is, the plurality of the magnonic crystal parts included in the spin wave devices 100, 200, 300 as shown in FIG. 1 to FIG. 3 or the plurality of the magnonic crystal parts as shown in FIG. 6(*a*) to FIG. 6(*h*) may be employed in this aspect.

Referring to FIG. 12, the spin wave device 1100 according to the invention includes first to third magnonic crystal parts 1110, 1120 and 1130 which are arranged in the moving direction of the spin wave as indicated by an arrow. It should be apparent that if necessary, two magnonic crystal parts or at least four of magnonic crystal parts may be employed. Although all of the first to third magnonic crystal parts 1110, 1120 and 1130 may have the same unit body as one another, it is preferable that the first to third magnonic crystal parts 1110, 1120 and 1130 have different unit bodies from one another in order to form various frequency bandgaps. In other words, at least two magnonic crystal parts among the plurality of the magnonic crystal parts have different structures of the unit bodies corresponding to one period from each other and/or different lengths in the moving direction of the spin wave of the unit bodies from each other.

FIG. 13 shows the results of observing, in the computer simulation manner, the frequency modes of the spin wave depending on the location of the waveguide after the spin wave passes through the spin wave device 1100 as shown in FIG. 12. In this case, the unit body of the first magnonic crystal part 1110 is configured as shown in FIG. 8 that the thickness t of the unit body is set to 10 nm, and the width $w_1$ of the first magnetic substance is set to 30 nm, and the width $w_2$ of the second magnetic substance is set to 24 nm, and $p_1=p_2$=12 nm. The unit body of the second magnonic crystal part 1120 is configured as shown in FIG. 8 that the thickness t of the unit body is set to 10 nm, and the width $w_1$ of the first magnetic substance is set to 30 nm, and the width $w_2$ of the second magnetic substance is set to 24 nm, and $p_1=p_2$=15 nm. The unit body of the third magnonic crystal part 1130 is configured as shown in FIG. 8 that the thickness t of the unit body is set to 10 nm, and the width $w_1$ of the first magnetic substance is set to 30 nm, and the width $w_2$ of the second magnetic substance is set to 24 nm, and $p_1=p_2$=30 nm.

Referring to FIG. 13, the region denoted by a reference numeral 1210 refers to the result appearing when the spin wave passes through the first magnonic crystal part 1110; the region denoted by a reference numeral 1220 refers to the result appearing when the spin wave passes through the second magnonic crystal part 1120; and the region denoted by a reference numeral 1230 refers to the result appearing when the spin wave passes through the third magnonic crystal part 1130. At this time, the spin wave employed has the frequency in a range of 0 to 100 GHz.

As shown in FIG. 13, three magnonic crystal parts 1110, 1120, 1130 made of different unit bodies with different shapes from one another may filter out the spin waves with different frequency ranges from one another respectively. Moreover, when three magnonic crystal parts 1110, 1120 and 1130 are arranged in one direction and in the same line, the frequency of the spin wave filtered out by such an arrangement is equal to the sum of the frequencies which are filtered out by three magnonic crystal parts 1110, 1120, 1130 respectively. Thus, it is possible to control various frequency ranges of the spin wave with the various arrangements of the plurality of the magnonic crystal parts.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The exemplary embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A spin wave device comprising a spin wave waveguide made of magnetic material, wherein the spin wave waveguide guides a spin wave so as to propagate in one direction, and comprises a magnonic crystal part which has a cross-section orthogonal to the direction, and at least one of a shape, area size, and center line of the cross-section periodically changes in the direction, wherein the spin wave waveguide comprises a plurality of the magnonic crystal parts which are arranged in the propagating direction of the spin wave.

2. The device of claim 1, wherein at least two magnonic crystal parts among the plurality of the magnonic crystal parts have different structures of unit bodies corresponding to one period from each other and/or different lengths in the propagating direction of the spin wave of the unit bodies from each other.

3. The device of claim 1, wherein the magnonic crystal part has varying period lengths so as to filter out a predetermined frequency region.

4. The device of claim 1, wherein the spin wave waveguide is made of ferromagnetic substance, anti-ferromagnetic substance, ferromagnetic substance, alloy based magnetic substance, oxide based magnetic substance, Heusler alloy based magnetic substance, magnetic semiconductor or combinations thereof.

5. The device of claim 1, wherein the spin wave waveguide has an elongate flat plate shape extending in the direction.

6. The device of claim 5, wherein the spin wave waveguide has a cross-section orthogonal to the propagating direction of the spin wave whose shape is a rectangular.

7. The device of claim 6, wherein the magnonic crystal part is configured so that a unit body formed of two magnetic substances made of the same material and with the same thickness of the cross-sections thereof and with different widths of the cross-sections thereof which are coupled to each other in the propagating direction of the spin wave is periodically arranged.

8. The device of claim 7, wherein the thickness of the cross-sections of the two magnetic substances is in a range of 1 to 200 nm.

9. The device of claim 7, wherein the unit body has a length in the propagating direction of the spin wave which is in a range of 5 to 500 nm.

* * * * *